(12) United States Patent
Nachreiner et al.

(10) Patent No.: US 10,434,610 B2
(45) Date of Patent: Oct. 8, 2019

(54) SOLDER PASTE WITH OXALIC ACID AND AMINE COMPONENT

(71) Applicant: Heraeus Deutschland GmbH & Co. KG, Hanau (DE)

(72) Inventors: Jens Nachreiner, Schlüchtern (DE); Joachim Wiese, Höchst/Odenwald (DE); Sebastian Fritzsche, Hanau (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 493 days.

(21) Appl. No.: 15/105,169

(22) PCT Filed: Dec. 12, 2014

(86) PCT No.: PCT/EP2014/077586
§ 371 (c)(1),
(2) Date: Jun. 16, 2016

(87) PCT Pub. No.: WO2015/091272
PCT Pub. Date: Jun. 25, 2015

(65) Prior Publication Data
US 2016/0311067 A1   Oct. 27, 2016

(30) Foreign Application Priority Data
Dec. 17, 2013 (EP) .................................. 13197694

(51) Int. Cl.
| *B23K 35/36* | (2006.01) |
| *B23K 35/26* | (2006.01) |
| *B23K 35/02* | (2006.01) |
| *H05K 3/34* | (2006.01) |
| *H05K 1/09* | (2006.01) |
| *H05K 1/18* | (2006.01) |

(52) U.S. Cl.
CPC ........ *B23K 35/3618* (2013.01); *B23K 35/025* (2013.01); *B23K 35/262* (2013.01); *H05K 1/092* (2013.01); *H05K 1/181* (2013.01); *H05K 3/3457* (2013.01); *H05K 3/3489* (2013.01); *H05K 2201/10621* (2013.01)

(58) Field of Classification Search
CPC . B23K 35/3612; B23K 35/36; B23K 35/3618
USPC .......................................................... 148/23
See application file for complete search history.

(56) References Cited

U.S. PATENT DOCUMENTS

| 5,127,968 A | * | 7/1992 | Gomi ................ B23K 35/3612 |
| | | | 148/23 |
| 5,417,771 A | | 5/1995 | Arita et al. |
| 2009/0152331 A1 | | 6/2009 | Schmitt et al. |
| 2013/0082094 A1 | | 4/2013 | Winkle et al. |

FOREIGN PATENT DOCUMENTS

| CN | 101484271 A | 7/2009 |
| CN | 103028868 A | 4/2013 |
| DE | 41 19 012 C1 | 12/1992 |
| DE | 4235575 A1 | 4/1994 |
| DE | 102005053553 A1 | 5/2007 |
| DE | 102012019198 A1 | 4/2013 |
| EP | 0389218 A1 | 9/1990 |
| EP | 0619162 A2 | 10/1994 |
| GB | 2198676 A | 6/1988 |
| WO | 2010000679 A1 | 1/2010 |
| WO | 2011023394 A1 | 3/2011 |

OTHER PUBLICATIONS

Int'l Search Report dated Jan. 20, 2015 in Int'l Application No. PCT/EP2014/077586.
Office Action dated Sep. 30, 2017 in CN Application No. 201480069066.4.

* cited by examiner

*Primary Examiner* — Weiping Zhu
(74) *Attorney, Agent, or Firm* — Panitch Schwarze Belisario & Nadel LLP

(57) ABSTRACT

A solder paste for the mounting of electronic components and substrates contains a mixture of oxalic acid, adipic acid, and an amine component. An electronic component may be mounted on a substrate through the use of the solder paste. Also, a module may utilize the solder paste.

12 Claims, 1 Drawing Sheet

SOLDER PASTE WITH OXALIC ACID AND AMINE COMPONENT

CROSS-REFERENCE TO RELATED APPLICATIONS

This application is a Section 371 of International Application No. PCT/EP2014/077586, filed Dec. 12, 2014, which was published in the German language on Jun. 25, 2015 under International Publication No. WO 2015/091272 A1 and the disclosure of which is incorporated herein by reference.

BACKGROUND OF THE PRESENT INVENTION

The present invention relates to a solder paste for the mounting of electronic components and substrates that contains a mixture of oxalic acid, adipic acid, and an amine component, as well as to a method for the production thereof. Moreover, the present invention relates to a method for the mounting of an electronic component on a substrate through the use of the solder paste according to the present invention, as well as to a module that comprises the solder paste according to the present invention.

The main application of solder pastes, in particular of soft solder pastes, is in the production of electronic circuits, where they serve mainly as electrical and thermal connections between a component and a substrate, for example between a semiconductor chip and a printed circuit board (PCB). The solder paste is being applied to the printed circuit board in this context. The semiconductor chip is then contacted to the printed circuit board via the solder paste. The solder paste is heated up in order to melt the solder in the paste by means of a reflow process by means of which electrical and/or thermal contacts are formed between the semiconductor chip and the printed circuit board. The solder pastes usually contain soldering fluxes that serve, inter alia, to dissolve the oxide layer on the surface of the soldering powder, components, and substrate and to thus provide for improved wettability during the soldering process. Since solder pastes are usually processed in the automatic production of electronic circuits by means of screen and stencil printing, the soldering fluxes usually contain additional substances, such as surfactants and additives, that improve the rheological properties of the soldering fluxes, and thus of the solder paste.

DE 10 2012 019 198 A1 describes a flux composition comprising a carboxylic acid and a polyamine flux, whereby the polyamine comprises non-substituted $C_{5-80}$ alkyl groups with at least two tertiary carbon atoms.

EP 0 619 162 A2 discloses a soldering flux comprising a 2-bisoxazoline compound, a dithiol, an organic carboxylic acid, and an activator. Moreover, the soldering flux can comprise an organic solvent, a thermoplastic resin and/or an epoxy group-containing compound.

DE 42 35 575 C2 describes a soft solder paste for soldering electronic components and circuits in the presence of a protective gas, in particular in the presence of nitrogen with a low residual oxygen content. In this context, the soft solder paste consists of an organic resin, an activator, and a solvent.

DE 41 19 012 C1 relates to a solder paste for electronics components that can be rinsed with water and contains water-soluble salts of fatty amines and organic acids as soldering flux mixture.

WO 2010/000679 A1 relates to soldering materials containing metal stearates. In this context, the particles of the soldering powder comprise a fine layer of solid metal stearate on the surface.

U.S. Pat. Application Publication No. 2009/0152331 A1 describes a resin-free solder paste comprising a metal powder, a polar solvent, a carboxylic acid, and a tertiary amine. The paste is particularly well-suited for under-filling (under-bumper metallization) as well as for mounting of surface-mounted components (surface-mounted technology).

One special challenge of the production of electronic circuits is the application and the mounting of components that comprise not only electrical connecting sites, but also thermal connecting sites on the underside of the component, such as, for example, QFPs with contacts to corresponding heat sinks in the substrate. The electrical contact sites, so-called "legs", serve also as spacer between the component and the substrate and are contacted by means of corresponding solder depots in the course of the reflow process. The thermal connecting sites are also connected to the substrate by means of a reflow process using solder depots, whereby the solder pastes used for thermal contacting can be different from those that are used for electrical contacting of the component to the substrate. In the course of this process, the introduced solder depot of the thermal connecting sites might spread upon heating. In this context, solder powder particles are driven out in the direction of the electrical contacting sites, usually in the form of so-called soldering balls, and might cause short-circuiting at these sites.

To prevent this from occurring, there is a need to have solder pastes that do not spread when heated and in which undesired solder balls are prevented from arising at the electrical contact sites and short-circuiting is thus prevented, while, at the same time, a stable mechanical, thermal and/or electronic connection between the component and the substrate is being generated. Moreover, there is a need for solder pastes that form clear wetting edges when melted and thus permit precise printing on substrates and thus permit the production of small integral circuits.

BRIEF SUMMARY OF THE PRESENT INVENTION

It is therefore an objective of the present invention to provide a solder paste for the mounting of components, in particular of components with electrical contacting sites, on substrates that forms clear wetting borders upon heating during the soldering process and does not change its shape. By this means, contacting between the solder paste and the electrical connecting sites and short-circuiting are prevented. Moreover, it is an objective of the present invention to provide a solder paste that provides a mechanical and thermal connection between component and substrate without any spreading thereof upon heating of the solder paste and/or without the generation of undesired solder balls.

Moreover, it is an objective of the present invention to provide solder pastes that comprise both good processability of the paste in screen printing procedures and good wettability.

The objectives are met through the subject matters of the independent claims of the present invention.

BRIEF DESCRIPTION OF THE SEVERAL VIEWS OF THE DRAWINGS

The foregoing summary, as well as the following detailed description of the present invention, will be better understood when read in conjunction with the appended drawings. For the purpose of illustrating the present invention, there are shown in the drawings embodiments which are presently preferred. It should be understood, however, that the present invention is not limited to the precise arrangements and instrumentalities shown.

In the drawings.

DETAILED DESCRIPTION OF THE PRESENT INVENTION

Figure 1:
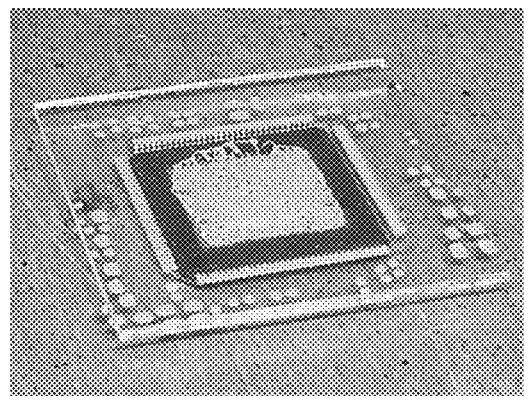
FIG. 1 illustrates an experimental setup in which the solder paste according to the present invention has been applied to the thermal connecting site of a QFP component and covered with a glass plate.

It has been found, surprisingly, that adding adipic acid and oxalic acid in conjunction with a special amine leads to the solder paste not spreading upon heating, such that solder balls, and therefore short-circuits, can be prevented from arising. Simultaneously, it has been found, surprisingly, that the wettability and processability were improved significantly.

In the scope of the present invention, the term "spreading" shall be understood to mean a spreading of the solder paste at the thermal connecting sites of the component upon heating, in particular at the thermal conditions that are prevalent during the mounting procedure due to which solder balls might arise and short-circuits at the electrical connecting sites of the component might be caused.

It has proven to be particularly advantageous for the flux to contain dicarboxylic acids and, in addition, one amine component.

Accordingly, one embodiment of the present invention is directed to a solder paste comprising
  a) flux, comprising
    i) adipic acid;
    ii) oxalic acid; and
    iii) amine selected from the group consisting of amine component A and amine component B, whereby
  amine component A is a diamine with tertiary amino groups and amine component B is a diamine or polyamine, in which at least 2 of the amino groups are separated from each other by at least 3 carbon atoms and which comprises at least 4 carbon atoms; and
  b) a solder.

The flux is an essential ingredient of the solder pastes according to the present invention.

a) Flux

Aside from the dicarboxylic acids, adipic acid and oxalic acid, the flux comprises, as an essential ingredient, an amine selected from the group consisting of amine component A and amine component B.

Amine Component A

Amine component A is a diamine that comprises at least one tertiary amino group, preferably two tertiary amino groups.

A preferred embodiment has amine component A selected from the group consisting of 1,2-tetramethylethylenediamine, 1,2-tetraethylethylenediamine and 1,2-tetrapropylethylenediamine, for example 1,2-tetra-n-propylethylenediamine and 1,2-tetra-iso-propylethylenediamine. Diamines, in which each tertiary amino group comprises two identical substituents, are particularly preferred.

In the scope of the present invention, a tertiary amine shall be understood to be an amine whose nitrogen atom bears three carbon-containing substituents.

Amine Component B

Amine component B is a diamine or polyamine, in which at least 2 of the amino groups are separated from each other by at least 3 carbon atoms and which comprises at least 4 carbon atoms.

Amine component B is a diamine or polyamine, in which the two amino groups are separated from each other by at least 3 carbon atoms and which comprises at least 4 carbon atoms. Alternatively, amine component B is a polyamine, in which at least 2 of the amino groups are separated from each other by at least 3 carbon atoms and which comprises at least 4 carbon atoms.

Due to the use of the solder paste according to the present invention for the mounting of components with electrical and/or thermal connecting sites on substrates, for example printed circuit boards, short-circuiting is prevented from occurring at the electrical connecting sites, since there is no undesired contact between the connecting sites. Moreover, it has been found, surprisingly, that the spreading properties of the solder paste can be improved even further if amine component B comprises a primary amino group.

Accordingly, amine component B comprises at least one primary amino group in a preferred embodiment of the present invention.

In a preferred embodiment, amine component B is selected from the group consisting of N-coco-1,3-diaminopropane, 1,6-diaminohexane, 1,7-diaminoheptane, 1,8-diaminooctane, 1,9-diaminononane, and 1,10-diaminodecane.

Preferably, the cocoa oil-derived residue of N-coco-1,3-diaminopropane has a chain length of 8 to 20 carbon atoms. A typical distribution of the carbon chain lengths of the cocoa oil-derived alkyl residues has, e.g., the following composition, in mol %: 5% C8, 6% C10, 50% C12, 19% C14, 10% C16, and 10% C18.

In a further preferred embodiment, the amine to be used, i.e. amine component A or amine component B, comprises no tertiary and/or quaternary carbon atoms.

In a further preferred embodiment, the amine comprises at least 6 carbon atoms. In this context, the carbon atoms can be present as connecting chain between two amino groups or can be bound to same as substituents of the nitrogen atoms.

The amount of amine in the flux is preferably selected appropriately such that good processability of the solder paste and good wettability of the surfaces of the component and substrate to be mounted are ensured.

Therefore, in a preferred embodiment of the solder paste according to the present invention, the flux comprises amine component A and/or amine component B in an amount of 0.1 to 2.0% by weight, preferably of 0.4 to 1.0% by weight, each relative to the total weight of the flux.

It has also been discovered, surprisingly, that the solder paste according to the present invention has good spreading properties if amine component B is used as an alternative to amine component A.

Amines, which comprise less than 2 amino groups and/or whose 2 amino groups are separated from each other by less than 3 carbon atoms and which comprise a total of less than 4 carbon atoms lead to insufficient properties, in particular with respect to the spreading behaviour, the wetting properties and the processability if they are not used in conjunction with amine component A and/or B.

In a further preferred embodiment, the flux of the solder paste according to the present invention further comprises monoamine. The monoamine is present in addition to amine component A and/or amine component B.

Particularly good results can be obtained, especially with regard to the processability, spreading behaviour, and melting properties of the solder paste according to the present invention, if the monoamine is a secondary and/or tertiary monoamine. Therefore, in a preferred embodiment, the monoamine is selected from the group consisting of secondary monoamine and tertiary monoamine, as well as mixtures thereof. Preferably, the flux contains monoamine in an amount of 0.5 to 5.5% by weight, preferably of 1.0 to 5.0% by weight, each relative to the total weight of the flux.

In a particularly preferred embodiment, the monoamine comprises 3 to 15, preferably 4 to 12, carbon atoms. Also preferably, the monoamine is selected from the group consisting of bis(2-ethylhexyl)amine, bis(2-methylhexylamine), diethylamine, triethylamine, cyclohexylamine, diethanolamine, and triethanolamine.

Further, it has been found that the processability, wetting properties, and spreading properties of the solder paste can be improved even further by the amount of dicarboxylic acid present in the flux.

In a preferred embodiment of the solder paste, the flux comprises adipic acid in an amount of 7 to 13% by weight, preferably of 8 to 12% by weight, each relative to the total weight of the flux. Mainly the wetting properties and the spreading behaviour of the solder paste can be adjusted by selecting the suitable amount of dicarboxylic acid in the flux.

Particularly good results with respect to the spreading behaviour, wetting properties, and processability of the solder paste according to the present invention can be attained, if the flux contains not only an amine, but also a mixture of oxalic acid and adipic acid. In this context, the advantageous effect of oxalic acid can be increased even more, if the amount of oxalic acid is within a limited range and if a certain amount is not being exceeded.

Therefore, in a preferred embodiment of the solder paste according to the present invention, the flux comprises oxalic acid in an amount of 0.3 to 2.0% by weight, preferably of 0.4 to 1.5% by weight, particularly preferably of 0.45 to 1.0% by weight, each relative to the total weight of the flux.

If the amount of oxalic acid in the flux is below the specified limit of 0.3% by weight, relative to the total weight of the flux, the corresponding solder pastes show slightly improved properties in terms of the spreading behaviour upon heating. Moreover, it has been found that it is advantageous for the amount of oxalic acid to be within the range specified above in order for the corresponding solder paste to be melted optimally.

Moreover, it has been found that the addition of further dicarboxylic acids other than oxalic acid and adipic acid to the flux has a positive effect on the properties of the solder paste, in particular on the processability and the spreading properties. However, the amount of further dicarboxylic acid should also be limited.

Therefore, in a preferred embodiment of the present invention, the flux comprises, in addition, dicarboxylic acids other than oxalic acid and adipic acid in an amount of 0 to 2.0% by weight, preferably in an amount of 0.01 to 1.0% by weight, each relative to the total weight of the flux. It has been found that an amount in excess of the range according to the present invention can have a negative impact on the wetting properties of the solder paste.

Preferably, the additional dicarboxylic acids other than oxalic acid and adipic acid are selected from the group consisting of malonic acid, succinic acid, and glutaric acid.

Therefore, the total amount of all dicarboxylic acids in the flux is maximally 15% by weight, preferably 7 to 13% by weight, in particular 8 to 12% by weight, each relative to the total weight of the flux, in a preferred embodiment of the solder paste according to the present invention.

In order to provide for optimal processability of the solder paste according to the present invention, especially with a view to automatic processing, the solder paste according to the present invention can contain further components that serve to support the application of the solder paste, its flow behaviour as well as the electrical and thermal connection of component and substrate.

Accordingly, the solder paste according to the present invention can, for example, contain thickening agents. In a preferred embodiment, the flux comprises, in addition, one or more thickening agents selected from the group consisting of ethylcellulose, hydrogenated castor oil, glycerol-tris-12-hydroxystearin, and modified glycerol-tris-12-hydroxystearin. Preferably, the flux contains thickening agent in an amount of 1.0 to 4.0% by weight, preferably of 1.7 to 3.0% by weight, each relative to the total weight of the flux.

In order to improve the application and the wetting properties of the solder paste according to the present invention, the flux can further contain solvent. Preferably, the solvent is selected from the group consisting of the following, soluble at 25° C., dioles, alcohols, etheralcohols, and ketones, in particular trimethylpropanol, 1,2-octandiol, 1,8-octandiol, 2,5-dimethyl-2,5-hexandiol, iso-bornylcyclohexanone, glycol ether, 2-ethyl-1,3-hexandiol, n-decylalcohol, 2-methyl-2,4-pentandiol, terpineol, and isopropanol as well as mixtures thereof. In a further preferred embodiment, the glycol ether is selected from the group consisting of mono-, di-, tri-propyleneglycolmethylether, mono-, di-, tri-propyleneglycol-n-butylether, mono-, di-, tri-ethyleneglycol-n-butylether, ethyleneglycolmethylether, triethyleneglycolmethylether, diethyleneglycoldibutylether, tetraethyleneglycoldimethylether, and diethyleneglycolmonohexylether as well as mixtures thereof.

Moreover, the flux of the solder paste according to the present invention can comprise a resin in order to impart on the paste the consistency required for the corresponding application. In a preferred embodiment of the solder paste, the solder paste is characterized in that the flux contains, in addition, a resin, preferably a resin selected from the group consisting of: colophony, tall oil, hydrogenated colophony, dimerised colophony, partially dimerised colophony, and mixtures thereof.

In a preferred embodiment of the solder paste, the flux comprises the resin in an amount of 35 to 50% by weight, preferably of 40 to 48% by weight, each relative to the total weight of the flux.

In a further preferred embodiment of the solder paste, the flux contains, in addition, halogen-containing compounds selected from the group consisting of aniline hydrochloride, glutamic acid hydrochloride, diethanolamine hydrochloride, triethanolamine hydrobromide, triethanolamine hydrochloride, triethanolamine hydrobromide, and trans-2,3-dibromo-2-buten-1,4-diol as well as mixtures thereof. The halogen-containing compounds can serve as additional activators that activate the surfaces of the component and substrate to be connected and thus provide for better connection of the components.

It has proven to be particularly advantageous that the amount of halogen-containing compounds in the flux does not exceed 5% by weight, relative to the total weight of the flux. Therefore, an embodiment of the solder paste according to the present invention, in which the flux comprises halogen-containing compounds in an amount of 0.1 to 3.0% by weight, preferably 0.5 to 2.0% by weight, each relative to the total weight of the flux, is preferred.

Moreover, an embodiment is preferred in which the flux comprises, in addition, additives in an amount of 0.05 to 3.0% by weight, each relative to the total weight of the flux. These additives preferably are compounds improving the wetting properties of the solder paste such as, for example, ethoxylated amine resin, amine resin, methyl esters of resins, n-oleylsarcosine, oleylimidazoline, and mixtures thereof b) Solder The flux is another essential ingredient of the solder paste according to the present invention.

The requirements for a solder paste for the mounting of components with electrical and thermal connecting sites on substrates relate not only to the spreading behaviour, in particular during the thermal contacting process, but also to the thermal connection of the component to the substrate that provides for dissipation of the heat generated during the operation of the component and for efficient cooling thereof.

In this context, the solder comprises good thermal conductivity in combination with limited electrical conductivity. These properties are evident especially in solders that comprise tin as their main component. Accordingly, an embodiment, in which the solder is a tin-based solder, is preferred.

In the scope of the present invention, a tin-based solder is a solder that comprises at least 80% by weight, preferably at least 83% by weight, in particular between 85 and 90% by weight, tin, whereby the weight specifications each relate to the total amount of solder.

In a preferred embodiment, the solder can comprise further metals aside from tin, for example in order to adjust the liquidus temperature of the solder to an advantageous range for the respective application.

Therefore, an embodiment, in which the solder comprises silver in an amount of 0.1 to 8% by weight, preferably 0.2 to 6% by weight, each relative to the total weight of the solder, is preferred.

In a further preferred embodiment, the solder comprises copper in an amount of 0.1 to 1.5% by weight, preferably 0.2 to 1.0% by weight, each relative to the total weight of the solder.

An embodiment, in which the solder is free of lead, is also preferred.

The solder paste according to the present invention is well-suited in particular for use in reflow processes, in which the solder is heated up to its liquidus temperature and thus provides for optimal connection between component and substrate. Accordingly, the liquidus temperature of the solder should not be too high for reasons of energy technology and taking into consideration the sensitive components and substrates.

Accordingly, an embodiment, in which the solder has a liquidus temperature in the range of 200 to 250° C., preferably in the range of 200 to 230° C., is preferred.

In a preferred embodiment, the solder is present as a powder, preferably having a weight-averaged particle size of 15 to 50 µm, preferably of 20 to 45 µm, determined in accordance with IPC-TM-650 2.2.14-2.2.14.2.

In a further preferred embodiment, the solder paste according to the present invention comprises the solder in an amount of 80 to 97% by weight, preferably 83 to 95% by weight, in particular 85 to 93% by weight, each relative to the total weight of the solder paste.

Moreover, in a preferred embodiment, the solder paste according to the present invention comprises the following components:
  a) 3 to 20% by weight flux, relative to the total weight of the solder paste, whereby the flux comprises
    i) 7 to 13% by weight adipic acid;
    ii) 0.3 to 1.5% by weight oxalic acid;
    iii) 0.1 to 2.0% by weight amine selected from the group consisting of amine component A and amine component B, whereby
  amine component A is a diamine with tertiary amino groups and amine component B is a diamine or polyamine, in which at least 2 of the amino groups are separated from each other by at least 3 carbon atoms and which comprises at least 4 carbon atoms; whereby the specifications in % by weight each relate to the total weight of the flux; and
  b) 80 to 97% by weight flux, relative to the total weight of the solder paste.

In a further preferred embodiment, the solder paste according to the present invention comprises:
  a) 3 to 20% by weight flux, relative to the total weight of the solder paste, whereby the flux comprises
    i) 7 to 13% by weight adipic acid;
    ii) 0.3 to 1.5% by weight oxalic acid;
    iii) 0.1 to 2.0% by weight amine selected from the group consisting of amine component A and amine component B, whereby
    amine component A is a diamine with tertiary amino groups and amine component B is a diamine or polyamine, in which at least 2 of the amino groups are separated from each other by at least 3 carbon atoms and which comprises at least 4 carbon atoms;
    iv) 0.05 to 2% by weight dicarboxylic acids other than adipic acid and oxalic acid;
    v) 35 to 50% by weight resin;
    vi) 0.1 to 3.0% by weight halogen-containing compound;
    vii) solvent; and
    viii) additives, if applicable;
  whereby the weight specifications each relate to the total weight of the flux; and
  b) 80 to 97% by weight flux, relative to the total weight of the solder paste.

In order to obtain optimal processability and the desired spreading behaviour, the solder paste according to the present invention preferably has a viscosity of 50 to 200 Pa*s, as determined at 23° C. and at a shearing rate of $10^{-1}$ s, measured with a plate-cone rheometer measuring system Physica from Anton-Paar.

Another embodiment of the present invention is directed to a method for producing the solder paste according to the present invention.

In this context, the method for producing the solder paste according to the present invention comprises the steps of:
  Mixing the components of the flux, in particular components i), ii) and iii); and
  adding a solder powder.

The addition of the solder powder preferably takes place by adding multiple aliquots to a given mixture of the flux components while stirring. It is also preferred that no elevated temperatures are required to obtain a homogeneous paste. Accordingly, the addition of the solder powder preferably takes place at normal temperature, for example at 20° C.

Preferably, the solder powder is a solder powder according to the present invention, as described above. Also preferably, the solder powder is a mixture of tin, silver, and copper, whereby the amount of silver is 0.1 to 8% by weight, preferably 0.2 to 6% by weight, and the amount of copper is 0.1 to 1.5% by weight, preferably 0.2 to 1.0% by weight, each relative to the total weight of the solder powder. Preferably, the difference from 100% by weight is made up by tin.

A further embodiment of the present invention is directed to a method for the mounting of a component on a substrate through the use of the solder paste according to the present invention. The method comprises the following steps:
 a) Providing a component having electrical connecting sites;
 b) providing a substrate, whereby the substrate comprises a surface that is provided with the solder paste according to the present invention;
 c) contacting the surface of the component to the surface of the substrate by means of the solder paste; and
 d) heating the solder paste beyond the liquidus temperature of the solder.

The component preferably is a surface-mounted component equipped with electrical connecting sites on the four sides of the housing of the component. Preferably, the component comprises a rectangular or square housing shape. Particularly preferably, the component is a quad flat package (QFP) and/or variants thereof. Moreover, the component preferably comprises a metallized surface by means of which the contacting to the solder paste according to the present invention takes place. In this context, the metal is preferably selected from the group consisting of copper, silver, aluminum, gold, nickel, tin, palladium as well as alloys thereof.

Preferably, the substrate is a substrate with at least one metal surface by means of which the contacting to the solder paste according to the present invention takes place. Suitable substrates include, for example, substrates made of metal, ceramics, paper or epoxy resin that comprise a metallized surface. The surface preferably comprises a metal selected from the group consisting of copper, silver, gold, nickel, aluminum, tin, palladium as well as alloys thereof.

The solder paste is heated beyond the liquidus temperature of the solder such that a connection between component and substrate by means of the solder paste is formed. In this context, the solder paste is preferably heated appropriately such that the solder transitions into its liquidus phase, but without the solder paste, component and/or substrate getting damaged. Preferably, the solder is heated to a temperature 5 to 60° C., preferably 10 to 50° C. above the liquidus temperature of the solder.

The components mounted to the substrate according to the attachment method according to the present invention show a significantly reduced incidence of short-circuits.

A component that is attached on a substrate and can be or is obtained according to the attachment method according to the present invention is therefore another embodiment of the present invention.

The use of the solder paste according to the present invention for connecting electronic components to substrates, whereby the contacting of the surface of the substrate and of the surface of the component takes place by means of the solder paste according to the present invention, is a further embodiment of the present invention.

A further embodiment of the present invention is directed to a module that is obtained through the use of the solder paste according to the present invention. The module comprises:
 1) a component with electrical connecting sites with a first surface;
 2) a substrate with at least one second surface; and
 3) a solder paste according to the present invention that directly contacts the first surface and the second surface.

Preferably, the module is well-suited for use in integrated circuits, mainly in the semiconductor industry.

Examples

The present invention shall be described in more detail by means of the following examples, which are in no way to be understood as to be limiting the inventive concept.

Test Methods:

i) Processability:

The processability of the solder pastes was tested using an automatic stencil printer equipped with a doctor blade. For this purpose, the paste was applied to a closed stencil, whereby the test period was 16 hours and the doctor blade performed a printing process every 10 minutes. After completion of the test, the optical quality of the paste was assessed. The processability of the pastes was rated to be good if they could be rolled smoothly over the stencil even after repeated passing/printing of the doctor blade for a period of 16 hours without the paste accumulating ahead of the doctor blade or on its sides.

ii) Wettability:

The wetting properties of the pastes were assessed by means of the melting test in accordance with IPC-TM-650 test method 2.4.45. The paste was applied onto a metal substrate for this purpose. Sheets sized 20×20×0.5 mm made of copper or brass served as substrates. If these sheets comprised an oxide layer on the surface, the surface was polished to be bare metal using grinding paper of grain size P600 and cleaned with alcohol. Copper sheets comprising a bright and pure surface were only cleaned with alcohol.

A stencil was used to print on the prepared metal substrates. For this purpose, the stencil was pushed firmly onto the substrate such that the open holes of the stencil were situated in the middle of the substrate. The paste was placed on a Japanese spatula and then streaked out, first with slight pressure, then with some more pressure, over the holes of the stencil until no more paste was situated on the stencil. Then the stencil was carefully removed while maintaining the pattern defined by the stencil.

The printed substrate was placed on a first heating plate that was set to a temperature below the liquidus temperature of the solder, i.e. to 200° C. in the present case. The substrate was kept on this plate for 2 minutes and was then immediately placed on a second heating plate whose temperature was approximately 50° C. above the liquidus temperature of the solder (peak temperature). After the paste was melted, the substrate was kept on the heating plate for another 5 seconds and was then taken off the plate and cooled down.

After the paste had cooled down, it was assessed if the paste was melted into spots that corresponded to the size of the holes of the stencil or into multiple small spots and whether or not the paste comprised clear edges after being melted. Moreover, it was assessed if the surface was glossy or matte.

The pastes were classified in 4 classes, whereby classes 1 and 2 were rated satisfactory results, whereas classes 3 and 4 represented unsatisfactory results.

Class 1: The melted solder paste is larger than the previously printed surface of the substrate. The wetting edges are uniform.
Class 2: The melted solder paste has the same size as the printed surface defined by the stencil. The wetting edges are uniform.
Class 3: The solder paste was melted into multiple large spots. The wetting edges are non-uniform and show voids.
Class 4: The solder paste was melted into multiple small spots that are smaller than the originally printed surface or the solder paste did not melt at all. There are no wetting edges present.

iii) Spreading Behavior

The spreading behavior of the solder pastes was assessed using the anti-capillary test (AC test). For this purpose, the solder paste was applied to the thermal connecting site of a QFP component (for example from Infineon Technologies AG, Germany) and covered with a glass plate. The QFP component was placed, by the opposite surface, on a heating plate at a temperature of 200° C. such that the behavior of the paste could be assessed. The experimental set-up is shown in FIG. 1.

Figure 2:
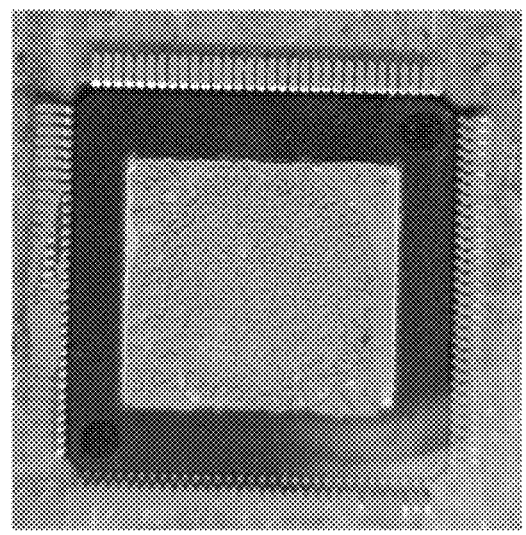
FIG. 2 illustrates satisfactory results in which the paste did not protrude beyond the area of the thermal connecting site.
Figure 3:
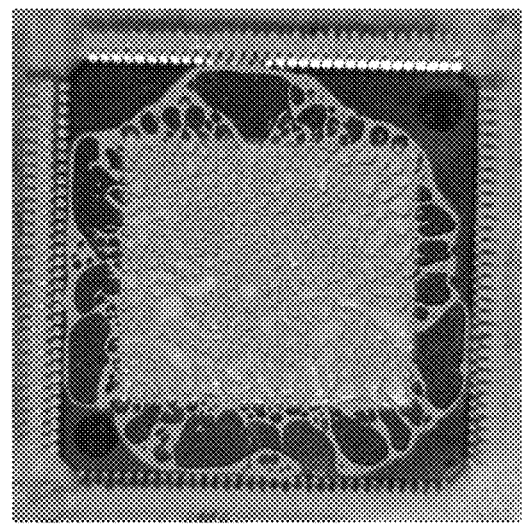
FIG. 3 illustrates unsatisfactory results in which excessive spreading of the paste can lead to contacting between the solder paste and the electrical connecting sites of the component.

The results obtained were rated by means of scores, whereby 0 to 2 represent satisfactory results, in which the paste did not protrude beyond the area of the thermal connecting site (FIG. 2). Scores of 2.5 to 3.0 represent unsatisfactory results, in which excessive spreading of the paste can lead to contacting between the solder paste and the electrical connecting sites of the component (FIG. 3).

The following solder pastes were assessed by means of the test methods specified above, whereby they need to attain satisfactory results in at least two of the tests in order to be considered to be according to the present invention.

Table 1 shows the composition of the solder paste according to the present invention as well as of pastes used for reference examples. The numbers given each are in units of % by weight. The properties of the pastes, such as processability, wetting properties, and spreading properties, were determined according to the methods described above and are summarized in Table 2.

The following solder was used:

SnAgCu: Sn: 96.5% Ag: 3.0% Cu: 0.5%, type 3 according to the IPC J-STD-006 standard.

TABLE 1

| Example | Cf. 1 | Cf. 2 | 3 | 4 | 5 | 6 | 7 | 8 | 9 | 10 |
|---|---|---|---|---|---|---|---|---|---|---|
| Flux | | | | | | | | | | |
| Adipic acid | 10.0 | 10.0 | 10.0 | 10.0 | 10.0 | 10.0 | 9.5 | 9.5 | 9.5 | 6.0 |
| Oxalic acid | | | 0.7 | 0.5 | 0.7 | 1.0 | 0.5 | 0.5 | 0.5 | 0.5 |
| Dicarboxylic acid | 0.5[a] | 0.5[b] | | | | | | | | |
| N-Coco-1,3-diaminopropane | | | | 0.5 | 0.5 | 0.5 | 0.5 | 0.5 | 0.5 | 0.5 |
| Bis-$C_8$-dialkylamine | 2.1 | 2.1 | 2.1 | | | | | | | |
| N,N-Dialkyl fatty amine | 2.1 | 2.1 | 2.1 | 3.7 | 3.7 | 3.7 | 3.7 | 3.7 | 3.7 | 3.7 |
| Hydrogenated colophony | 45.4 | 45.4 | 45.3 | 45.4 | 45.3 | 45.2 | 45.8 | 44.5 | 46.0 | 47.0 |
| Triethanolamine•HBr | 1.5 | 1.5 | 1.5 | 1.5 | 1.5 | 1.5 | 1.5 | 1.5 | | 1.5 |
| Castor oil | 2.7 | 2.7 | 2.7 | 2.7 | 2.7 | 2.7 | 2.7 | 2.7 | 2.7 | 2.7 |
| Tri-Propyleneglycol-n-butylether | 35.7 | 35.7 | 35.6 | 35.7 | 35.6 | 35.4 | 35.8 | 37.1 | 37.1 | 38.1 |
| Flux (total) | 100.0 | 100.0 | 100.0 | 100.0 | 100.0 | 100.0 | 100.0 | 100.0 | 100.0 | 100.0 |
| Paste | | | | | | | | | | |
| Solder (SnAgCu) | 89.25 | 89.25 | 89.25 | 89.25 | 89.25 | 89.25 | 89.25 | 89.25 | 89.25 | 89.25 |
| Flux | up to 100.0 | up to 100.0 | up to 100.0 | up to 100.0 | up to 100.0 | up to 100.0 | up to 100.0 | up to 100.0 | up to 100.0 | up to 100.0 |

[a]Succinic acid
[b]Glutaric acid

TABLE 2

| Example | Cf. 1 | Cf. 2 | 3 | 4 | 5 | 6 | 7 | 8 | 9 | 10 |
|---|---|---|---|---|---|---|---|---|---|---|
| Wettability (Class) | 3 | 3 | 2 | 2 | 2 | 2 | 2 | 2 | 2 | 4 |
| AC test (Score) | 2.5 | 3 | 1 | 1.5 | 1 | 1 | 1 | 1 | 1 | 1 |
| Processability | poor | poor | good | good | good | good | good | good | good | good |

As is evident from Table 2, the pastes according to the present invention of examples 3 to 10 show very good results in the AC test and in the wettability. Moreover, all pastes according to the present invention showed good processing properties and were easy to spread even after repeated passage of the doctor blade. In the optical test, all melted and subsequently cooled pastes showed a smooth and glossy surface with clear wetting edges.

Reference example 1 shows a conventional solder paste that contains not only adipic acid, but also 0.5% by weight oxalic acid as acid component, relative to the total weight of the flux. As is evident from the results of Table 2, the conventional paste showed only unsatisfactory results in terms of the tested properties.

Even replacing succinic acid by the same amount of glutaric acid, as shown in reference example 2, did not afford an improvement with regard to the desired properties.

Example 12 shows that the amount of adipic acid can be used to adjust the properties of the solder paste to suit the corresponding requirements. Accordingly, the properties can be further reinforced positively by an amount of adipic acid from within the preferred range according to the present invention.

Table 3 shows the general composition of various pastes, in which the test amine component was varied. The test amines used, as well as the test results of the solder pastes, are summarized in Table 4

TABLE 3

| Component | Amount (% by weight) |
|---|---|
| Adipic acid | 10.0 |
| Oxalic acid | 0.5 |
| Test amine | 0.5 |
| Bis-$C_8$-dialkylamine | 2.1 |
| N,N-Dialkyl fatty amine | 2.1 |
| Hydrogenated colophony | 44.9 |
| Castor oil | 2.7 |
| Triethanolamine•HBr | 1.5 |
| Tri-Propyleneglycol-n-butylether | 35.7 |
| Flux (total) | 100.0 |
| Paste | |
| Solder | 89.25 |
| Flux | up to 100.0 |

TABLE 4

| | Test amine | Wettability | AC test | Processability |
|---|---|---|---|---|
| 11 | N-Coco-1,3-diaminopropane | 2 | 0 | good |
| 12 | 1,6-Diaminohexane | 2 | 0 | good |
| 13 | 1,10-Diaminodecane | 2 | 0 | good |
| 14 | 1,2-Tetramethylenediamine | 2 | 1 | good |
| Cf. 15 | 1,2-Diaminoethane | 2 | 0 | poor |
| Cf. 16 | 1,3-Diaminopropane | 2 | 0 | poor |
| Cf. 17 | 1,2-Diaminocyclohexane | 3 | 0 | poor |

As is evident from examples 11 to 14 of Table 4, in which the amines meet the inventive definition of amine component A (example 14) or amine component B (examples 11 to 13), the corresponding solder pastes show excellent results in terms of wettability, processability, and in the AC test. As soon as the amine component no longer meets the inventive definition (examples 15 through 17), the corresponding solder pastes show poor processability. In some cases, such as when amines are used, in which the 2 amino groups are not separated from each other by at least 3 carbon atoms (reference example 17), the wettability properties also suffer such that precise printing on a substrate is not feasible with these pastes.

As is evident from the examples discussed, all pastes according to the present invention show good processability and excellent properties in terms of their wettability and spreading behaviour. Accordingly, owing to the pastes described in the present invention, stable attachment of components on substrates is feasible without any short-circuiting, while ensuring good heat dissipation. Due to the good processability of the solder paste according to the present invention, precise and rapid printing of, for example, printed circuit boards is feasible.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A soldering paste comprising:
   a) a flux comprising:
      i) adipic acid;
      ii) oxalic acid; and
      iii) an amine selected from the group consisting of amine component A and amine component B, wherein amine component A is selected from the group consisting of 1,2-tetramethylethylenediamine, 1,2-tetraethylethylenediamine, and 1,2-tetrapropylethylenediamine and wherein amine component B is selected from the group consisting of N-coco-1,3-diaminopropane, 1,6-diaminohexane, 1,7-diaminoheptane, 1,8-diaminooctane, 1,9-diaminononane, and 1,10-diaminodecane; and
   b) a solder,
   wherein the flux does not contain a metal.

2. The soldering paste according to claim 1, wherein the flux comprises amine component A and/or amine component B in an amount of 0.1 to 2.0% by weight relative to a total weight of the flux.

3. The soldering paste according to claim 1, wherein the flux comprises adipic acid in an amount of 7 to 13% by weight relative to a total weight of the flux.

4. The soldering paste according to claim 1, wherein the flux comprises oxalic acid in an amount of 0.3 to 2.0% by weight relative to a total weight of the flux.

5. The soldering paste according to claim 1, wherein the flux comprises additional dicarboxylic acids other than oxalic acid and adipic acid in an amount of 0 to 2% by weight relative to a total weight of the flux.

6. The soldering paste according to claim 5, wherein a total amount of all dicarboxylic acids in the flux is maximally 15% by weight relative to the total weight of the flux.

7. The soldering paste according to claim 1, wherein the flux further comprises a monoamine, relative to the total weight of the flux, wherein the monoamine is selected from the group consisting of secondary monoamine and tertiary monoamine.

8. The soldering paste according to claim 1, wherein the solder is a tin-based solder.

9. The soldering paste according to claim 1, wherein the soldering paste comprises solder in an amount of 80 to 97% by weight relative to a total weight of the soldering paste.

10. A module comprising:
   1) a component with electrical connecting sites having a first surface;
   2) a substrate with at least one second surface; and
   3) a soldering paste according to claim 1 that directly contacts the first surface and the at least one second surface.

11. A method for producing a soldering paste according to claim 1, the method comprising the steps of:
   mixing components of the flux together to form a mixture; and
   adding a solder powder to the mixture.

12. A method for mounting a component on a substrate comprising the following steps:

a) providing a component having electrical connecting sites;
b) providing a substrate, the substrate comprising a surface that is provided with a soldering paste according to claim 1;
c) contacting a surface of the component to the surface of the substrate by the soldering paste; and
d) heating the soldering paste beyond a liquidus temperature of the solder.

* * * * *